United States Patent
Kawaguchi et al.

(10) Patent No.: US 10,514,309 B2
(45) Date of Patent: Dec. 24, 2019

(54) TEMPERATURE ABNORMALITY DETECTION METHOD FOR POWER CONVERSION DEVICE AND TEMPERATURE ABNORMALITY DETECTION DEVICE FOR POWER CONVERSION DEVICE

(71) Applicant: Nissan Motor Co., Ltd., Yokohama-shi, Kanagawa (JP)

(72) Inventors: Shinji Kawaguchi, Kanagawa (JP); Kazushige Namiki, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 16/321,857

(22) PCT Filed: Aug. 23, 2016

(86) PCT No.: PCT/JP2016/074446
§ 371 (c)(1),
(2) Date: Jan. 30, 2019

(87) PCT Pub. No.: WO2018/037472
PCT Pub. Date: Mar. 1, 2018

(65) Prior Publication Data
US 2019/0178728 A1    Jun. 13, 2019

(51) Int. Cl.
| | | |
|---|---|---|
| *G01K 15/00* | (2006.01) | |
| *G01K 1/00* | (2006.01) | |
| *G01K 13/00* | (2006.01) | |
| *H02M 7/48* | (2007.01) | |
| *H05K 7/20* | (2006.01) | |
| *H02P 29/68* | (2016.01) | |
| *H02M 7/537* | (2006.01) | |

(Continued)

(52) U.S. Cl.
CPC .............. *G01K 13/00* (2013.01); *H02M 7/48* (2013.01); *H02M 7/537* (2013.01); *H02P 29/68* (2016.02); *H05K 7/20927* (2013.01); *H05K 7/20945* (2013.01); *H02M 2001/327* (2013.01); *H02P 27/08* (2013.01)

(58) Field of Classification Search
USPC ............................................ 374/1, 152, 110
See application file for complete search history.

(56) References Cited

U.S. PATENT DOCUMENTS

| | | | |
|---|---|---|---|
| 9,595,908 B2 * | 3/2017 | Odaka | H02P 29/68 |
| 2014/0376592 A1* | 12/2014 | Hollunder | G01K 7/42 374/152 |
| 2016/0161347 A1* | 6/2016 | Morinaga | G01K 15/007 374/1 |

FOREIGN PATENT DOCUMENTS

| | | |
|---|---|---|
| CN | 1670497 A | 9/2005 |
| CN | 103493612 A | 1/2014 |

(Continued)

*Primary Examiner* — Mirellys Jagan
(74) *Attorney, Agent, or Firm* — Global IP Counselors, LLP (57) ABSTRACT

A temperature abnormality detection method is provide for a power conversion device which includes calculating a temperature difference between a first inverter temperature and a cooling water temperature, and then determining a temperature abnormality exists when a first abnormality determination condition is satisfied, i.e., when the temperature difference exceeds a preset difference threshold and the first inverter temperature exceeds a preset power conversion unit threshold temperature.

3 Claims, 4 Drawing Sheets

(51) Int. Cl.
*H02M 1/32* (2007.01)
*H02P 27/08* (2006.01)

(56) References Cited

FOREIGN PATENT DOCUMENTS

| | | |
|---|---|---|
| CN | 103843238 A | 6/2014 |
| CN | 203747396 U | 7/2014 |
| CN | 104242771 A | 12/2014 |
| CN | 105493391 A | 4/2016 |
| CN | 105637631 A | 6/2016 |
| EP | 2 950 626 A1 | 12/2015 |
| JP | 2005-269832 A | 9/2005 |
| JP | 2006-149064 A | 6/2006 |
| JP | 2013-11179 A | 1/2013 |
| JP | 2015-82869 A | 4/2015 |
| JP | 2015-208081 A | 11/2015 |

\* cited by examiner

TEMPERATURE ABNORMALITY DETECTION METHOD FOR POWER CONVERSION DEVICE AND TEMPERATURE ABNORMALITY DETECTION DEVICE FOR POWER CONVERSION DEVICE

CROSS-REFERENCE TO RELATED APPLICATIONS

This application is a U.S. national stage application of International Application No. PCT/JP2016/074446, filed on Aug. 23, 2016.

BACKGROUND

Technical Field

The present invention relates to a temperature abnormality detection method for a power conversion device and a temperature abnormality detection device for a power conversion device.

Background Information

Conventionally there is known a technology wherein a cooling device for circulating cooling water is provided to a power conversion device such as an inverter device that drives a rotary electric machine, thereby protecting the power conversion device from overheating, and temperature abnormalities in the power conversion device or the cooling device are detected (for example, see Japanese Laid-Open Patent Application No. 2006-149064-Patent Document 1). In this prior art, a protective control such as restricting the driving of the device is implemented by carrying out temperature abnormality detection based on a comparison between a temperature threshold and the difference between the temperature of the cooling water and the temperature of the power conversion device. Therefore, compared to technology in which a temperature abnormality is detected based only on the temperature of the power conversion device, a more accurate determination of a temperature abnormality, that is, associated with the need to restrict the driving of the rotary electrical machine, can be carried out, thereby making it possible to protect the system while responding to the required driving force of the rotary electrical machine.

SUMMARY

At low ambient temperatures in which the cooling water temperature has become extremely low, the difference in relation to the temperature of the power conversion device tends to become large; therefore, in the prior art, there is the risk that this difference will exceed the temperature threshold, and the driving of the power conversion device is restricted, even though the power conversion device itself is at a drivable temperature.

In view of the problem described above, an object of the present invention is to provide a temperature abnormality detection method for a power conversion device and a temperature abnormality detection device for a power conversion device that can more accurately determine an abnormal temperature state in which the driving of the power conversion device is not preferred.

In the temperature abnormality detection method for a power conversion device of the present invention, first, a difference calculation step for calculating the difference between the temperature of the power conversion device and the temperature of a cooling fluid is executed. Next, an abnormality determination step is executed, in which a temperature abnormality is determined when an abnormality determination condition is satisfied, i.e., when the above-described difference exceeds a preset difference threshold and the power conversion unit temperature exceeds a preset power conversion unit temperature threshold.

In addition, the temperature abnormality detection device for a power conversion device of the present embodiment comprises a power conversion unit temperature detection unit for detecting the temperature of a power conversion unit and a cooling fluid temperature detection unit for detecting the cooling fluid temperature in a cooling fluid flow path that passes through the power conversion unit and cools the power conversion unit. In addition, an abnormality determination unit for determining a temperature abnormality calculates the difference between the power conversion unit temperature and the cooling fluid temperature, and determines the temperature abnormality when the abnormality determination condition, in which this difference exceeds the preset difference threshold and the power conversion unit temperature exceeds the preset power conversion unit temperature threshold, is met.

In the temperature abnormality detection method and the temperature abnormality detection device for a power conversion device of the present invention, if the temperature of the power conversion device itself is below the power conversion unit temperature threshold and the power conversion device is operable, a temperature abnormality is not determined even when the difference between the power conversion unit temperature and the cooling fluid temperature, which is at a low temperature, exceeds the temperature threshold, such as at low ambient temperatures. Therefore, it becomes possible to more accurately determine the abnormal temperature state in which driving of the power conversion device is not preferred.

DETAILED DESCRIPTION OF THE EMBODIMENTS

In the following, preferred embodiments for realizing an abnormality detection method for a power conversion device of the present invention will be described based on the embodiments illustrated in the drawings.

First Embodiment

In the following, a temperature abnormality detection method and a temperature abnormality detection device for a power conversion device of a first embodiment will be described.

First, the configuration of a power conversion device A to which the temperature abnormality detection method according to the first embodiment is applied will be described with reference to FIG. 1.

Figure 1:
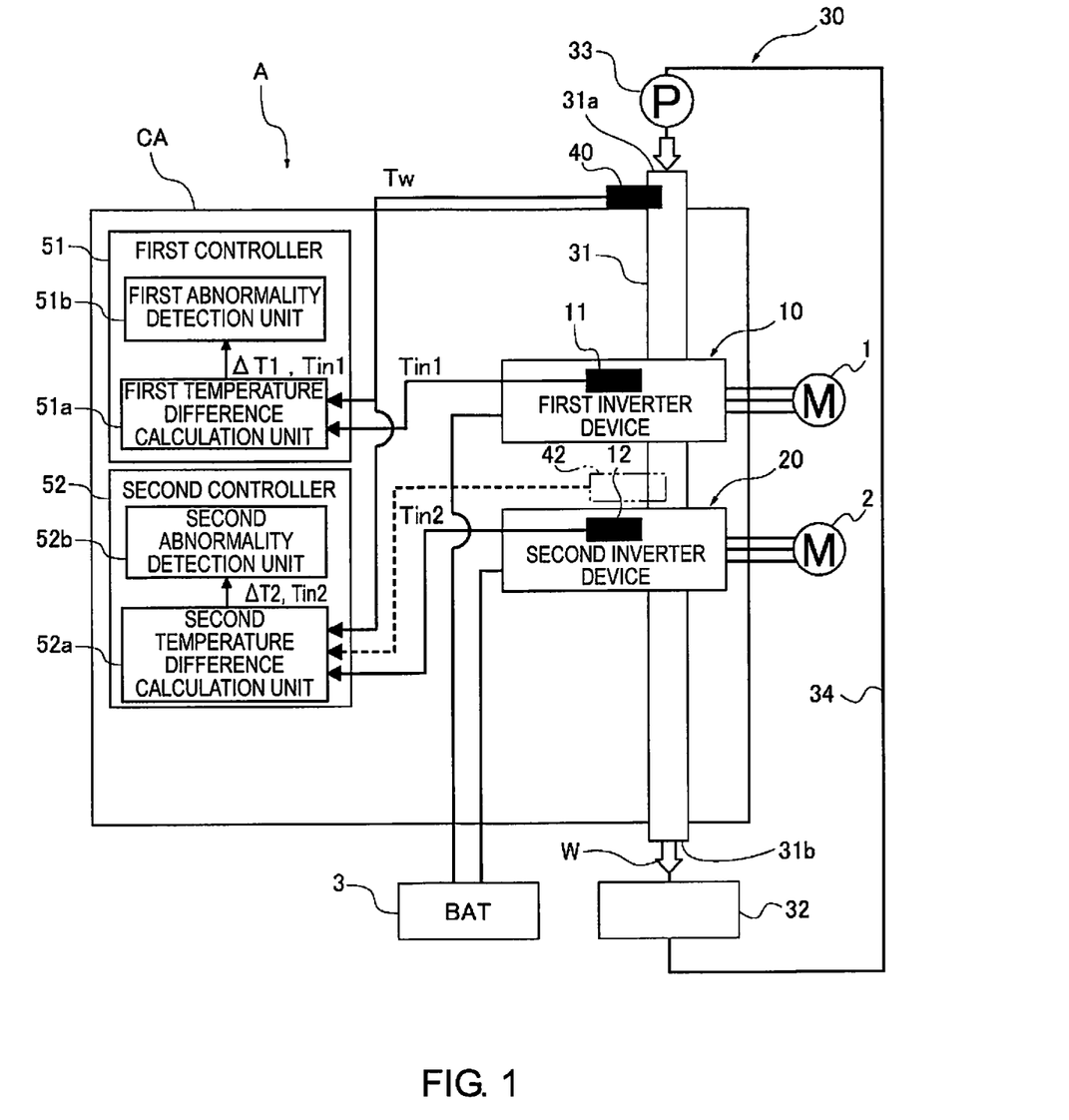
FIG. 1 is an overall view schematically illustrating a power conversion device to which the temperature abnormality detection method of a first embodiment is applied.

The power conversion device A illustrated in FIG. 1 comprises a first inverter device (power conversion unit) 10 for driving a first power generation machine 1, and a second inverter device (power conversion unit) 20 for driving a second power generation machine 2.

The first power generation machine 1 and the second power generation machine 2 are mounted in an electric vehicle, a hybrid vehicle, or the like, which is not shown. The intended use of the two power generation machines 1, 2 is not particularly limited. For example, the two power generation machines 1, 2 may be used as drive sources for supplying driving force to drive wheels, which are not shown. Alternatively, one of the two power generation machines 1, 2 may be used as the drive source, and the other may be used as a generator for generating power by being driven by a drive source, such as an engine, which is not shown.

The two inverter devices 10, 20 are mounted in a casing CA that accommodates the power conversion device A. The first inverter device 10 converts direct current, which is the electric power from a battery 3, into alternating current and supplies the alternating current to the first power generation machine 1, thereby driving the first power generation machine 1, or converts the alternating current generated by the first power generation machine 1 into direct current and supplies the direct current to the battery 3 for charging.

Although not shown, the first inverter device 10 contains a smoothing capacitor and a power module, such as an IGBT module. Additionally, a secondary battery (lithium-ion secondary battery, nickel hydrogen battery, or the like) having a voltage control range of about several hundred volts is employed as the battery 3.

As with the first inverter device 10, the second inverter device 20 can also convert direct current from the battery 3 to alternating current and supply the alternating current to the second power generation machine 2, and also can convert the alternating current generated by the second power generation machine 2 into direct current and supply the direct current to the battery 3 for charging. Although not shown, this second inverter device 20 also contains a smoothing capacitor and a power module.

Furthermore, the first inverter device 10 and the second inverter device 20 respectively include a first inverter temperature sensor 11 and a second inverter temperature sensor 12, which detect the temperatures (Tin1, Tin2) of power modules, etc., provided with semiconductor elements therein.

In addition, the power conversion device A comprises a cooling device 30. The cooling device 30 comprises a cooling water path 31, a radiator 32, a pump 33, and a circulation path 34, and cools the two inverter devices 10, 20 by circulating cooling water W serving as the cooling fluid.

The cooling water path 31 is formed in the casing CA and goes from an inflow port 31a at a first end through the first inverter device 10 (power conversion unit of the preceding stage) and the second inverter device 20 (power conversion unit of the subsequent stage) in that order, and reaches an outflow port 31b at a second end.

A circulation path 34, which extends from the outflow port 31b to the inflow port 31a and is provided midway with a radiator 32 and a pump 33, is connected to the cooling water path 31. The pump 33 circulates cooling water W by drawing the cooling water W from the outflow port 31b and pumping the cooling water to the inflow port 31a. The radiator 32 radiates the heat from the cooling water W to the outside air, thereby cooling the cooling water W.

Furthermore, a water temperature sensor 40 is provided in the vicinity of the inflow port 31a, which is upstream of the first inverter device 10 in the cooling water path 31. The cooling water temperature (cooling fluid temperature) Tw detected by the water temperature sensor 40 and a first inverter temperature Tin1 detected by the above-mentioned first inverter temperature sensor 11 are input to a first controller 51. In addition, the cooling water temperature Tw and a second inverter temperature Tin2 detected by the second inverter temperature sensor 12 are input to a second controller 52. The first controller 51 and the second controller 52 are constituted by so-called microcomputers.

The first controller 51 determines the presence/absence of a temperature abnormality of the first inverter device 10 and, when a temperature abnormality is determined, carries out a process for protecting at least the first inverter device 10 and the first power generation machine 1. The second controller 52 determines the presence/absence of a temperature abnormality of the second inverter device 20 and, when a temperature abnormality is determined, carries out a process for protecting at least the second inverter device 20 and the second power generation machine 2. It may be configured such that when a temperature abnormality of one of the two controllers 51, 52 is determined, a process for protecting the two inverter devices 10, 20 and the two power generation machines 1, 2 is carried out.

Next, the configurations of the first controller 51 and the second controller 52 will be described. The first controller 51 comprises a first temperature difference calculation unit 51a and a first abnormality detection unit 51b. The first temperature difference calculation unit 51a receives inputs of the first inverter temperature Tin1 detected by the first inverter temperature sensor 11 and the cooling water temperature Tw detected by the water temperature sensor 40, and calculates a first temperature difference $\Delta T1$ ($\Delta T1 = Tin1 - Tw$), which is the difference between the two.

The first abnormality determination unit 51b determines the presence/absence of a temperature abnormality based on the first temperature difference $\Delta T1$ and the first inverter temperature Tin1 and, when a temperature abnormality is determined, executes a prescribed protective operation process. The flow of this process will be described based on the flow chart of FIG. 2.

Figure 2:
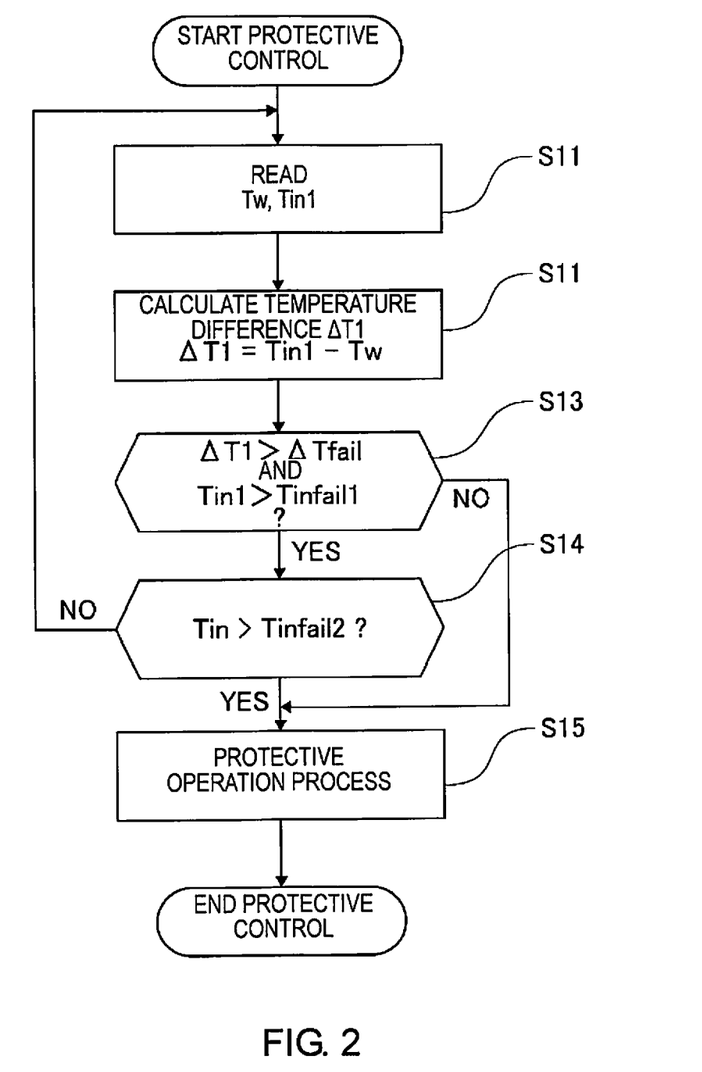
FIG. 2 is a flowchart illustrating the flow of a protective control process of the power conversion device.

In the first Step S11, the first inverter temperature Tin1 and the cooling water temperature Tw are read by the first temperature difference calculation unit 51a, and the process proceeds to the subsequent Step S12.

In Step S12, the first temperature difference $\Delta T1$, which is the difference between the first inverter temperature Tin1 and the cooling water temperature Tw, is calculated by the first temperature difference calculation unit 51a by calculating $\Delta T1 = Tin1 - Tw$. This first temperature difference $\Delta T1$ and first inverter temperature Tin1 are input to the first abnormality detection unit 51b.

In the subsequent Step S13, an abnormality is determined (YES) when the following abnormality determination condition is met; otherwise, a non-abnormality is determined (NO). Here, the abnormality determination condition is met when the first temperature difference $\Delta T1$ exceeds a preset difference threshold $\Delta Tfail$ according to the first abnormality determination unit 51b and the first inverter temperature Tin1 exceeds a preset inverter temperature abnormality first threshold Tinfail1.

The difference threshold ΔTfail, set based on experiments or simulations, is a value with which it is possible to determine the presence/absence of an abnormality of either the first inverter device 10 or the cooling device 30 at normal ambient temperatures, and is a value having the same characteristics as that of the prior art. In addition, the inverter temperature abnormality first threshold Tinfail1, set based on experiments or simulations, is a value with which it is possible to determine the presence/absence of an abnormality of the first inverter device 10 at low ambient temperature.

Then, in Step S13, when the abnormality determination condition of ΔT1>ΔTfail and Tin1>Tinfail1 is met (YES), the process proceeds to Step S15; otherwise (no abnormality (NO)) the process proceeds to Step S14.

In Step S14, to which the process proceeds when it is determined to be non-abnormal in Step S13, it is determined whether the first inverter temperature Tin1 exceeds an inverter temperature abnormality second threshold Tinfail2. The inverter temperature abnormality second threshold Tinfail2 is set to a higher temperature than the inverter temperature abnormality first threshold Tinfail1 (refer to FIG. 3B), and is a threshold value that detects a temperature abnormality of the first inverter device 10 at high ambient temperature. The inverter temperature abnormality second threshold Tinfail2, set based on experiments or simulations, is an upper limit temperature at which the internal semiconductors, etc., can operate (semiconductor upper limit temperature, refer to FIG. 3A).

Then, when Tin1>Tinfail2 is satisfied in Step S14, a temperature abnormality is determined (YES) and the process proceeds to Step S15, and when Tin1≤Tinfail2 is satisfied, a non-temperature abnormality is determined (NO) and the process returns to Step S11.

In Step S15, to which the process proceeds when a temperature abnormality is determined (YES) in either Step S13 or Step S14, a preset protective operation process is executed, and the control is ended. One example of this protective operation process is a process for stopping the operations of the first inverter device 10 and the first power generation machine 1, but no limitation is imposed thereby. For example, the operation of the first power generation machine 1 may be restricted rather than completely stopped, or the operations of the second inverter device 20 and the second power generation machine 2 may be stopped or restricted in addition to stopping the operation of the first inverter device 10 and the first power generation machine 1.

Next, returning to FIG. 1, the second controller 52 will be described. The second controller 52 has a similar configuration as the first controller 51 and a similar processing content as the first controller 51; therefore the differences will be mainly described.

The second controller 52 comprises a second temperature difference calculation unit 52a and a second abnormality detection unit 52b. The second temperature difference calculation unit 52a calculates a second temperature difference ΔT2, which is the difference between the second inverter temperature Tint and the cooling water temperature (hereinafter referred to as subsequent stage cooling water temperature) Tw2 upstream of the second inverter device 20.

Here, the subsequent stage cooling water temperature Tw2 can be directly detected by providing a water temperature sensor 42 on the upstream side of the second inverter device 20 and detecting the subsequent stage cooling water temperature Tw2, which is the water temperature upstream of the second inverter device 20, as shown by the chain double-dashed line in FIG. 1.

Alternatively, the subsequent stage cooling water temperature Tw2 can be calculated from the cooling water temperature Tw detected by the water temperature sensor 40. In the first embodiment, the second temperature difference calculation unit 52a is configured to calculate the subsequent stage cooling water temperature Tw2 from the cooling water temperature Tw, and receives as inputs the cooling water temperature Tw and the second inverter temperature Tin2 detected by the second inverter temperature sensor 12, as shown in the drawing.

That is, the subsequent stage cooling water upstream of the second inverter device 20 is heated by means of heat exchange with the first inverter device 10, and thereby is at a higher temperature than the cooling water temperature Tw detected by the water temperature sensor 40. Therefore, the second temperature difference calculation unit 52a sets, as an addition value to be added, a value obtained by converting the loss in the first inverter device 10 during operation into a temperature increase of the cooling water temperature Tw, and adds this value to the cooling water temperature Tw detected by the water temperature sensor 40 to obtain the subsequent stage cooling water temperature Tw2. The temperature increase due to this loss may be calculated based on the operating state of the first inverter device 10 but, in the first embodiment, the temperature increase is set to the increase in the temperature of the cooling water temperature Tw due to heat generation of the first inverter device 10 at the time of the maximum loss that is assumed in the first inverter device 10. An example of a time of maximum loss is when the first power generation machine 1 is in a locked state. For example, a locked state can be when the wheels of the vehicle strike a wheel stop or the like, and the vehicle cannot move forward even when there is an attempt to do so; that is, a case in which rotation does not occur in the first power generation machine 1, even though the first power generation machine 1 is being energized and driven.

In such a locked state the energy loss in the first power generation machine 1 is maximal, and the energy is lost as thermal energy. As for the addition value to be added to the cooling water temperature Tw, such a locked state is actually reproduced, and the relationship at that time among the cooling water temperature Tw, the command value for the first power generation machine 1, and the temperature increase of the cooling water temperature Tw is stored in the first controller 51 in the form of a map or an arithmetic expression, for example. Therefore, the second temperature difference calculation unit 52a calculates the addition value from the command value to the first power generation machine 1 and the cooling water temperature Tw at the time the addition is carried out, and adds this value to the cooling water temperature Tw to obtain the subsequent stage cooling water temperature Tw2.

The second abnormality determination unit 52b determines the presence/absence of an abnormality based on the second temperature difference ΔT2 and the second inverter temperature Tin2 and, when an abnormality is determined, executes a protective operation process.

Here, the flow of the protective control process in the second controller 52 is similar to the flow of the process in the first controller 51 shown in FIG. 2; thus a flow chart is omitted but a brief explanation is provided below. A difference between the protective control process in the second controller 52 and the protective process shown in FIG. 2 is that the cooling water temperature Tw and the first inverter temperature Tin1 used by the first controller 51 are replaced by the subsequent stage cooling water temperature Tw2 and the second inverter temperature Tin2. In addition, another difference is that a calculation to obtain the subsequent stage cooling water temperature Tw2 from the cooling water temperature Tw is added before the temperature difference ΔT2 is calculated in Step S12.

The protective control process in the second controller 52 is briefly described below; first, the second inverter temperature Tin2 and the cooling water temperature Tw are read by the second temperature difference calculation unit 52a, and the subsequent stage cooling water temperature Tw2 is calculated (Step S11).

Next, the second temperature difference ΔT2, which is the difference between the second inverter temperature Tin2 and the subsequent stage cooling water temperature Tw2, is calculated in the second temperature difference calculation unit 52a by calculating ΔT2=Tin2−Tw2 (Step S12).

Next, it is determined whether a first abnormality determination condition is met by the second abnormality detection unit 52b. This first abnormality determination condition is met when the second temperature difference ΔT2 exceeds the preset difference threshold ΔTfail, and the second inverter temperature Tin2 exceeds the preset inverter temperature abnormality first threshold Tinfail1 (Step S13). The difference threshold ΔTfail and the inverter temperature abnormality first threshold Tinfail1 may be the same values as the values used by the first controller 51 described above, or may be values different from the values used by the first controller 51 in accordance with the characteristics of the second inverter device 20, and the like. When the first abnormality determination condition is not satisfied (NO), it is further determined whether the second inverter temperature Tin2 exceeds the inverter temperature abnormality second threshold Tinfail2 (whether a second abnormality determination condition is satisfied) (Step S14).

Then, when either the first abnormality determination condition or the second abnormality determination condition is satisfied, the protective operation process is executed, and when both abnormality determination conditions are not satisfied, the above-described process is repeated (Step S15).

Next, the operation of the first embodiment will be described. When the inverter devices 10, 20 are driven, heat corresponding to the loss that occurs in the switching element or the power module, which are not shown, is generated, and the inverter temperatures Tin1, Tin2 increase. In addition, each inverter device 10, 20 is cooled by the cooling device 30, and thus the cooling water temperature Tw in the cooling water path 31 is increased. The cooling water is then cooled by the radiant heat of the radiator 32 and then again supplied to the cooling water path 31.

Then, the first controller 51 and the second controller 52 detect temperature abnormalities of the semiconductor elements of the power modules that are built into the first and second inverter devices 10, 20, etc., and execute protective control for preventing these elements from being destroyed by heat.

Figure 3A:
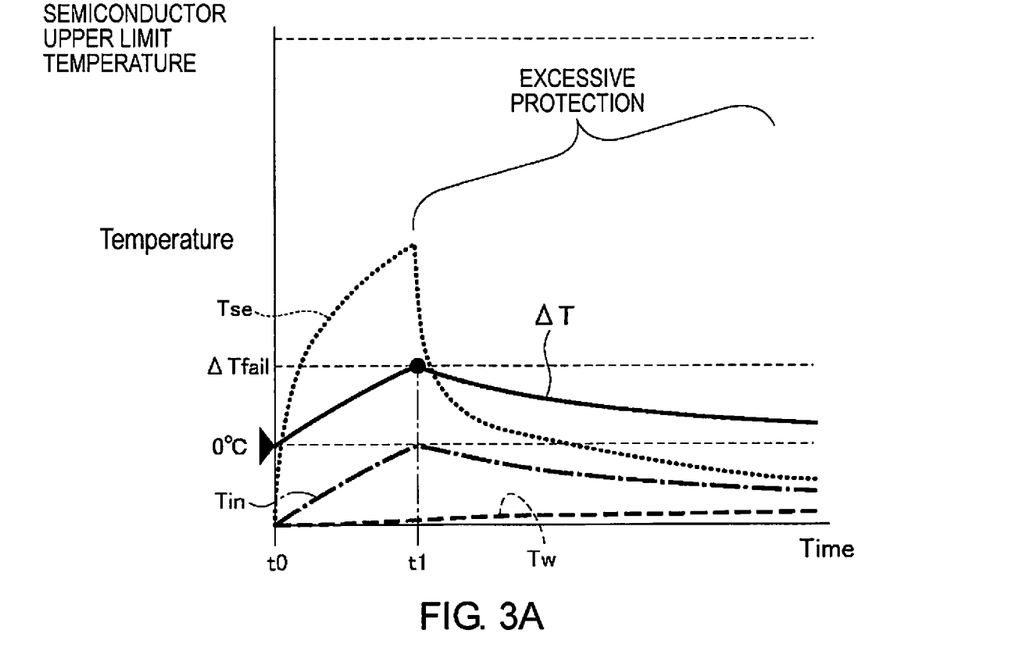
FIG. 3A is a time chart illustrating an example of operation at low ambient temperature in a comparative example with respect to the first embodiment.

Before describing the effects of the first embodiment, the problems to be solved when an abnormality determination is carried out based only on the temperature difference ΔT, as in the prior art, will be described, based on FIGS. 3A and 4A. In the following descriptions of the problems and of the operation of the first embodiment, a representative case in which the first inverter device 10, from among the two inverter devices 10, 20, is driven, will be described FIG. 3A shows a case in which the first power generation machine 1 starts to be driven (at time t0) and the first inverter temperature Tin1 gradually increases in a low-temperature environment in which the cooling water temperature Tw has become extremely low. In this case, because the cooling water temperature Tw is low, the temperature difference ΔT gradually increases after driving is initiated (at time t0).

Then, at time t1, the temperature difference ΔT exceeds the difference threshold ΔTfail, and the protective operation process is executed, which thus decreases the first inverter temperature Tin1 as well as the temperature difference ΔT.

However, in this case, the reason that the temperature difference ΔT takes on a large value is because the cooling water temperature Tw is low; in addition, the temperature of a semiconductor provided in the first inverter device 10, Tse, which is the temperature of the semiconductor itself, is below the semiconductor upper limit temperature, which is the upper limit temperature at which the semiconductor operates normally. Consequently, excessive protection is carried out in a situation that does not intrinsically require execution of a protective operation process, creating the problem that the first power generation machine 1 cannot output normal driving force.

Figure 3B:
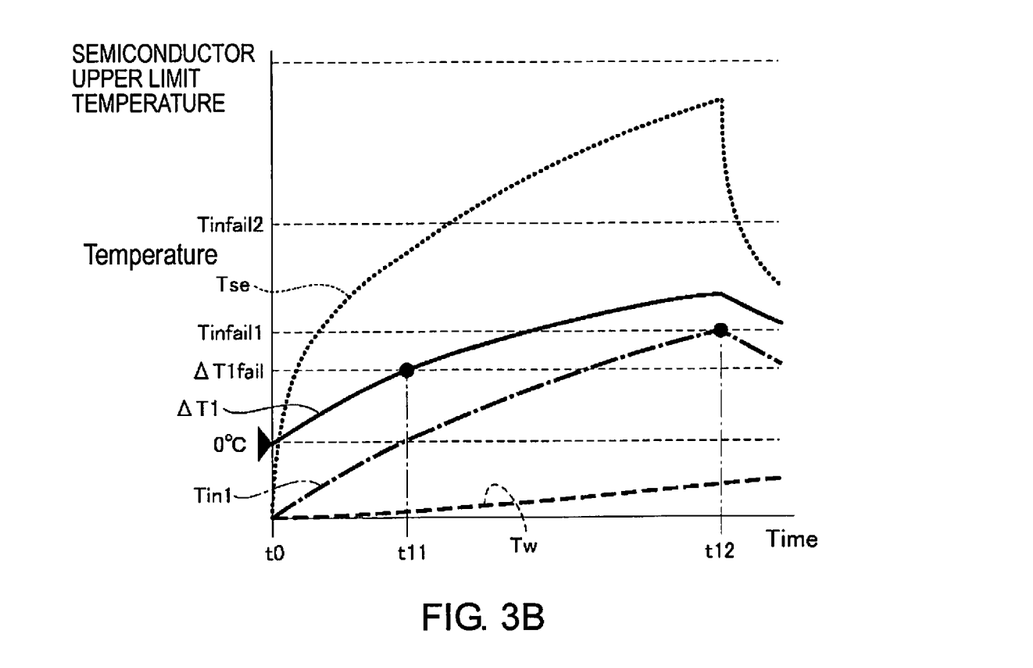
FIG. 3B is a time chart illustrating an example of operation at low ambient temperature in the first embodiment.

Next, the operation of the first embodiment will be described based on FIG. 3B. FIG. 3B also shows a case in which the first power generation machine 1 starts to be driven at time t0 in a low-temperature environment, in the same manner as FIG. 3A.

In this case, because the cooling water temperature Tw is low, the temperature difference ΔT1 with respect to the first inverter temperature Tin1 increases and exceeds the temperature threshold ΔTfail at time t11, as in the case of FIG. 3A. However, the first abnormality determination condition is not satisfied at this time (t11), since the first inverter temperature Tin1 is below the inverter temperature abnormality first threshold Tinfail1.

That is, in the first embodiment, because the first abnormality determination condition is satisfied when ΔT1>ΔTfail and Tin1>Tinfail1, the first abnormality determination condition is not satisfied at time t11 when only ΔT1>ΔTfail is satisfied; thus, the protective operation process is not executed at that time.

Thereafter, the first inverter temperature Tin1 continues to increase toward the inverter temperature abnormality first threshold Tinfail1 and reaches the inverter temperature abnormality first threshold Tinfail1 at time t12. That is, the first abnormality determination condition of ΔT1>ΔTfail and Tin1>Tinfail1 is satisfied at this time t12. As a result, the protective operation process is started, thereby decreasing the first inverter temperature Tin1 as well as the semiconductor temperature Tse.

In this manner, in the first embodiment, the start time (t12) of the protective operation process is subsequent to the processing operation start time (t1) of the comparative example compared with the operation example shown in FIG. 3A, and the first inverter device 10 and the first power generation machine 1 can continue to be driven, even in the excessive protection region shown in FIG. 3A. It is thereby possible to appropriately protect the first inverter device 10 and to avoid unnecessary stoppage or restrictions on the operation of the first inverter device 10 and the first power generation machine 1.

Next, the operation of the first embodiment and the comparative example at high temperatures will be described. First, the problem of the comparative example will be described based on FIG. 4A. FIG. 4A shows an operation for a case in which both the cooling water temperature Tw and the first inverter temperature Tin1 are high, such as immediately after travel at high ambient temperatures, and the first power generation machine 1 and the first inverter device 10 start to be driven at time t0 when the temperature difference ΔT is therefore low.

In this case, because the temperature difference ΔT is low, as described above, the temperature difference ΔT continues to be below the difference threshold ΔTfail, and the protective operation process is not executed.

However, because the first inverter temperature Tin1 is high, as described above, the semiconductor temperature Tse has reached the semiconductor upper limit temperature at time t31, and an appropriate protective operation is not executed.

Next, the operation of the first embodiment will be described based on FIG. 4B. As with FIG. 4A, FIG. 4B also shows an operation for a case in which both the cooling water temperature Tw and the first inverter temperature Tin1 are high in a high-temperature environment, and the first power generation machine 1 and the first inverter device 10 start to be driven at time t0 when the temperature difference ΔT is therefore low.

Figure 4A:
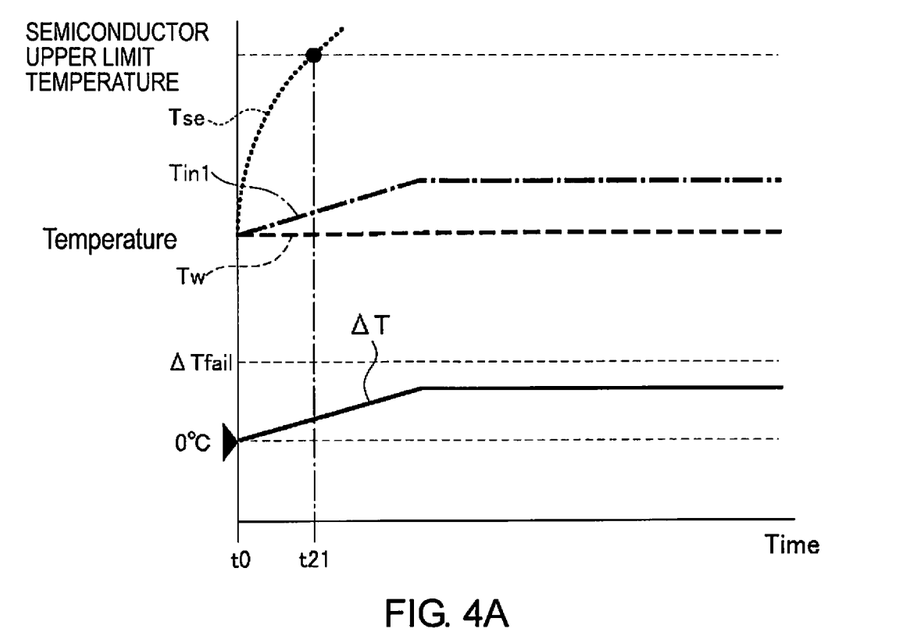
FIG. 4A is a time chart illustrating an example of operation at high ambient temperature in a comparative example with respect to the first embodiment.
Figure 4B:
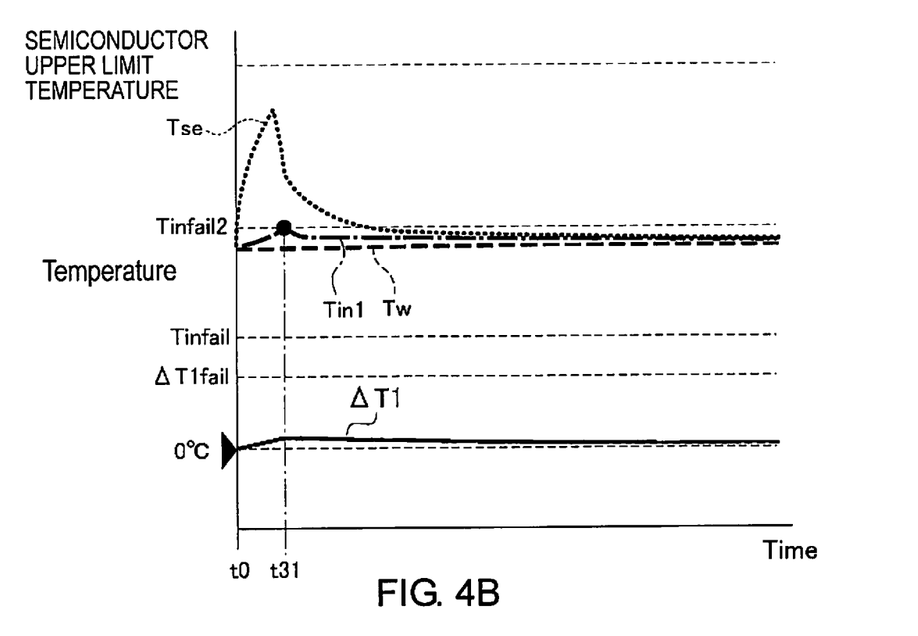
FIG. 4B is a time chart illustrating an example of operation at high ambient temperature in the first embodiment.

In this case, since the temperature difference ΔT1 is small, ΔT1≤ΔTfail and the first abnormality determination condition of Step S13 is not satisfied, as in the case of FIG. 4A. However, since the first inverter temperature Tin1 is high, the first inverter temperature Tin1 reaches the inverter temperature abnormality second threshold Tinfail2 at time t31; therefore, the second abnormality determination condition is satisfied and the protective operation process is executed. As a result, as shown in the drawing, the semiconductor temperature Tse starts to decrease from time t31 and is prevented from reaching the semiconductor upper limit temperature.

The effects of the first embodiment are as follows.

1) The temperature abnormality detection method for a power conversion device A according to the first embodiment is a temperature abnormality detection method for a power conversion device A provided with a first inverter device 10 (second inverter device 20) as a power conversion unit that converts and transmits electric power, and a cooling water path 31 that cools the first inverter device 10 (second inverter device 20), comprising: a difference calculation step (Step S12) for calculating a temperature difference ΔT1 (ΔT2), which is the difference between a first inverter temperature Tin1 (second inverter temperature Tin2) as the temperature of the first inverter device 10 (second inverter device 20) and a cooling water temperature Tw (Tw2), which is the temperature of a cooling fluid of the cooling water path 31; and a first abnormality determination step (Step S13) for determining a temperature abnormality when a first abnormality determination condition is satisfied, i.e., when the temperature difference ΔT1 (ΔT2) exceeds a preset difference threshold ΔTfail and the first inverter temperature Tin1 (Tin2) exceeds a preset power conversion unit threshold temperature Tinfail. Thus, at low ambient temperatures, even when the temperature difference ΔT1 (ΔT2) exceeds the difference threshold ΔTfail, the first abnormality determination condition is not satisfied at a temperature below the inverter temperature abnormality first threshold Tinfail1 at which the first inverter device 10 (second inverter device 20) can operate normally. As a result, it is possible to avoid stoppage or restricted driving due to excessive protection, compared to a case in which the execution of the protective operation process is determined only by comparing the temperature difference ΔT and the difference threshold ΔTfail.

2) The temperature abnormality detection method for a power conversion device A according to the first embodiment further comprises a second abnormality determination step (Step S14) for determining a temperature abnormality, when the first abnormality determination condition of the first abnormality determination step (Step S13) is not satisfied, if the first inverter temperature Tin1 (second inverter temperature Tin2) exceeds an inverter temperature abnormality second threshold Tinfail2, which is set to a higher value than the inverter temperature abnormality first threshold Tinfail1. Thus, the second abnormality determination condition is satisfied when the temperature difference ΔT1 (ΔT2) is small in a high-temperature environment and the first inverter temperature Tin1 (second inverter temperature Tin2) exceeds the inverter temperature abnormality second threshold Tinfail2. Thus, when the temperature reaches a high temperature which hinders the operation of the first inverter device 10 (second inverter device 20), it becomes possible to carry out an appropriate temperature abnormality determination regardless of the temperature difference ΔT1 (ΔT2), in order to avoid the occurrence of failure of the first inverter device 10 (second inverter device 20) due to high temperatures.

3) In the temperature abnormality detection method for a power conversion device A according to the first embodiment, the first inverter device 10 and the second inverter device 20 are provided along the cooling water path 31 as the power conversion unit, and in the difference calculation step (Step S12), with respect to the first and second inverter devices 10, 20, the temperature difference ΔT1 between the first inverter temperature Tin1 and the cooling water temperature Tw is calculated for the first inverter device 10, as the power conversion unit in a preceding stage disposed on the upstream side in the cooling water path 31, and the temperature difference ΔT2 between a second inverter temperature Tint and a cooling water temperature Tw2, as a temperature obtained by adding to the cooling water temperature Tw the loss component of the first inverter device 10 converted into a temperature, is calculated for the second inverter device 20, as the power conversion unit in a subsequent stage that is disposed further downstream in the cooling water path 31 than the first inverter device 10. Thus, it is not necessary to provide a water temperature sensor 42 for detecting the subsequent stage cooling water temperature Tw2 upstream of the second inverter device 20 as the power conversion unit of the subsequent stage, and thus it is possible to reduce the number of parts as well as costs.

4) In the temperature abnormality detection device for a power conversion device according to the first embodiment, a value, which is set based on the temperature due to a maximum loss assumed in the first inverter device 10, is used as the temperature obtained by converting the loss component. Thus, it is possible to simplify the calculation for temperature addition and to suppress costs.

5) The temperature abnormality detection device for a power conversion device according to the first embodiment comprises: a first inverter device 10 (second inverter device 20) as a power conversion unit that converts and transmits electric power; a cooling water path 31 that passes through the first inverter device 10 (second inverter device 20) and cools the first inverter device 10 (second inverter device 20); a first inverter temperature sensor 11 (second inverter temperature sensor 12) as a power conversion unit temperature detection unit that detects the temperature of the first inverter device 10 (second inverter device 20); a water temperature sensor 40 as a cooling fluid temperature detection unit that detects the cooling water temperature Tw of the cooling water path 31; and a first controller 51 (second controller 52) as an abnormality determination unit that receives as inputs the cooling water temperature Tw (Tw2) and the first inverter temperature Tin1 (second inverter temperature Tin2), calculates the temperature difference ΔT1 (ΔT2) as the difference between the first inverter temperature Tin1 (second inverter temperature Tin2) and the cooling water temperature Tw (Tw2), and determines a temperature abnormality when an abnormality determination condition is satisfied, i.e., when the temperature difference ΔT1 (ΔT2) exceeds a preset difference threshold ΔTfail and the first inverter temperature Tin1 (second inverter temperature Tin2) exceeds a preset inverter temperature abnormality first threshold Tinfail1. Thus, at low ambient temperatures, even when the temperature difference ΔT1 (ΔT2) exceeds the difference threshold ΔTfail, the first abnormality determination condition is not satisfied at a temperature below the inverter temperature abnormality first threshold Tinfail1 at which the first inverter device 10 (second inverter device 20) can operate normally. As a result, it is possible to avoid stoppage or restricted driving due to excessive protection, compared to a case in which the execution of the protective operation process is determined only by comparing the temperature difference ΔT and the difference threshold ΔTfail.

Furthermore, in the temperature abnormality detection device for a power conversion device according to the first embodiment, the first controller 51 (second controller 52) determines a temperature abnormality when the first abnormality determination condition of the first abnormality determination step (Step S13) is not satisfied, if the first inverter temperature Tin1 (second inverter temperature Tin2) exceeds an inverter temperature abnormality second threshold Tinfail2, which is set to a higher value than the inverter temperature abnormality first threshold Tinfail1. Thus, the second abnormality determination condition is satisfied when, at high ambient temperatures, the temperature difference ΔT1 (ΔT2) is small and the first inverter temperature Tin1 (second inverter temperature Tin2) exceeds the inverter temperature abnormality second threshold Tinfail2. In this way, when the temperature reaches a high temperature which hinders the operation of the first inverter device 10 (the second inverter device 20), it becomes possible to carry out an appropriate temperature abnormality determination regardless of the temperature difference ΔT1 (ΔT2), in order to avoid the occurrence of failure of the first inverter device 10 (the second inverter device 20) due to high temperatures.

Other embodiments of the present invention will now be described. In the description of the other embodiments, configurations common to the first embodiment and the other embodiments have been assigned the same reference symbols, and the descriptions thereof omitted, and only the differences with respect to given embodiment have been described.

Second Embodiment

In the second embodiment, another example for calculating the addition value that is added to the cooling water temperature Tw, obtained by converting the loss component of the first inverter device 10 into temperature, in the second controller 52, will be shown.

In the second embodiment, the addition value to be added to the cooling water temperature Tw (value obtained by converting the loss component of the first inverter device 10 into a temperature) is calculated based on loss calculation information that includes the semiconductor characteristics, the carrier frequency f, and the current I in the first inverter device 10.

The first inverter device 10 comprises a well-known bridge-connected insulated gate bipolar transistor (hereinafter referred to as IGBT), and a diode (free-wheeling diode, hereinafter referred to as FWD).

Therefore, the steady loss of the IGBT of the first inverter device 10 is calculated using the following equation (1), and the switching loss of the IGBT is calculated using the following equation (2).

In addition, the steady loss of the FWD of the first inverter device 10 is calculated using the following equation (3), and the switching loss of the FWD is calculated using the following equation (4). The power module loss in the first inverter device 10 is then calculated from these values using the following equation (5).

$$P(Isat) = \frac{1}{2\pi}\int_0^\pi (Ic \times \sin x) \times (Vce(sat) \times \sin x) \times \frac{1 + D \times \sin(x + \theta)}{2} dx \quad (1)$$

$$P(Isw) = Esw \times f \times \frac{1}{\pi} \quad (2)$$

$$P(Fsat) = \frac{1}{2\pi}\int_0^\pi (-Ic \times \sin x) \times (-Vf \times \sin x) \times \frac{1 + D \times \sin(x + \theta)}{2} dx \quad (3)$$

$$P(Fsw) = Err \times f \times \frac{1}{2} \quad (4)$$

$$P(PM) = \{P(Isat) + P(Isw)\} \times N(I) + \{P(Fsat) + P(Fsw)\} \times N(F) \quad (5)$$

Ic; Switching element current of IGBT (first power generation machine current)
Vce(sat); ON-voltage of switching element of IGBT
D; PWM modulation factor
Esw; Switching loss per pulse of IGBT
f: PWM carrier frequency
N(1); number of IGBT chips
N(F); number of FWD chips
Vf: ON-voltage of switching element of FWD
Err; Switching loss per 1 pulse of FWD Furthermore, the loss in the first inverter device 10 obtained from the equations above (power module loss P (PM)) is converted into temperature, and the addition value corresponding to the temperature increase of the cooling water is calculated. This addition value is obtained in advance by repeatedly conducted experiments and using a table or a calculation equation that is set to enable the value to be obtained in accordance with the power module loss P (PM) and the cooling water temperature Tw.

Thus, in the second embodiment, a value that is closer to the temperature increase of the cooling water W due to heat generation caused by actual loss in the first inverter device 10 can be set as the addition value, and therefore the abnormality detection accuracy is even higher.

2-1) In the temperature abnormality detection device for a power conversion device according to the second embodiment, the second temperature difference calculation unit 52a of the second controller 52 uses as the addition value, which is the temperature obtained by converting the loss component to be added to the cooling water temperature Tw, a value calculated based on loss calculation information that includes the number of FWD chips N(F), the number of IGBT chips N(I), the PWM modulation factor D as a semiconductor characteristic, carrier frequency f, current Ic and voltage Vce(sat) of the power module of the first inverter device 10. Therefore, it is possible to obtain the optimum addition value corresponding to the operating state of the first inverter device 10, and to carry out a more accurate abnormality detection. It should be noted that the addition value can be obtained based on any one of the current Ic, the voltage Vce(sat), the semiconductor characteristic (carrier frequency f, PWM modulation factor D, the number of IGBT chips N(1), and the number of FWD chips N(F)).

Third Embodiment

The third embodiment is an example in which the method of converting the loss component of the first inverter device 10 into temperature and adding the same to the cooling water temperature Tw to obtain the addition value differs from the methods of the first and second embodiments.

That is, in the third embodiment, a value estimated based on the first temperature difference ΔT1 between the first inverter temperature Tin1 and the cooling water temperature Tw is used as the addition value that is added after the loss component of the first inverter device 10 is converted into temperature.

Here, the loss is estimated by receiving as input the first temperature difference ΔT1 calculated by the first temperature difference calculation unit 51a, and by inverse calculation of the loss in the first inverter device 10 from this first temperature difference ΔT1. Furthermore, the second temperature difference calculation unit 52a of the second controller 52 estimates an addition value corresponding to the temperature increase component of the cooling water due to this loss component and sets the temperature obtained by adding this addition value to the cooling water temperature Tw as the subsequent stage cooling water temperature Tw2. As for the estimation of this addition value, values corresponding to the temperature difference ΔT1 and the driving state (for example, powering, regeneration, locking, etc.) of the first power generation machine 1 at that time are stored in the form of a map. The second temperature difference calculation unit 52a of the second controller 52 calculates the second temperature difference ΔT2 between the above-described added temperature and the second inverter temperature Tin2.

Thus, in the third embodiment, the temperature increases of the cooling water corresponding to the estimated loss component of the first inverter device 10 is estimated based on the temperature difference ΔT1 (ΔT2). Thus, it is possible to obtain the subsequent stage cooling water temperature Tw2 as the added temperature with great accuracy, thereby increasing the abnormality detection accuracy.

3-1) In the temperature abnormality detection device for a power conversion device according to the third embodiment, the second temperature difference calculation unit 52a of the second controller 52 uses an estimated value based on the temperature difference ΔT1, which is the difference between the first inverter temperature Tin1, which is the temperature of the first inverter device 10, and the cooling water temperature Tw, as the temperature of the loss component that is added. That is, the heat generation state of the first inverter device 10 is estimated based on the difference between the first inverter temperature Tin1 and the cooling water temperature Tw, thereby enabling the addition value to be obtained with high accuracy. Therefore, the subsequent stage cooling water temperature Tw2 can be estimated with high accuracy based on this highly accurate addition value, and abnormality detection of the second inverter device 20 can be carried out with high accuracy on that basis.

The temperature abnormality detection method for a power conversion device and the temperature abnormality detection device for a power conversion device of the present invention were described above based on embodiments, but specific configurations thereof are not limited to these embodiments, and various modifications and additions to the design can be made without departing from the scope of the invention according to each claim in the Claims.

For example, in the embodiments, inverter devices were shown as the plurality of power conversion units for converting and transmitting electric power, but the power conversion units are not limited to inverter devices; other power conversion units such as converters may be used as well. Thus, in the embodiments, a power generation machine was shown as the output target of the power conversion units, but the output target is not limited thereto, and other devices, such as a battery, can be used.

Moreover, in the embodiments, an example was shown in which the number of inverter devices as the power conversion devices is "2," but the number of power conversion devices may be "1" or an integer of "3" or more.

Additionally, cooling water was shown as the cooling fluid that flows through the cooling fluid flow path, but the cooling fluid is not limited thereto; liquids other than water such as oil, gas, or other fluids may be used.

Furthermore, in the first embodiment, the temperature increases of the water temperature at the time of maximum loss assumed in the first inverter device was set as the temperature to which the temperature of the loss component of the power conversion unit of the preceding stage is added, but no limitation is imposed thereby. For example, it may be set as the increase in the water temperature at the time of maximum loss during the driving state of the first power generation machine, in accordance with that driving state. That is, it may be set as the temperature increase at the time of maximum loss for each driving state, such a powering, regeneration, and while locked.

Additionally, in the second embodiment, an example was shown in which the temperature increase of the loss component is obtained based on equations (1)-(5); however, it is not limited to the equations (1)-(5), as long as the value is calculated based on loss calculation information that includes the semiconductor characteristics, the carrier frequency, and the current supplied to the power conversion unit.

The invention claimed is:

1. A temperature abnormality detection method for a power conversion device provided with a power conversion unit that converts and transmits electric power, and a cooling fluid flow path that cools the power conversion unit, the method comprising:
 a difference calculation step for calculating a temperature difference between a power conversion unit temperature, which is a temperature of the power conversion unit, and a cooling fluid temperature in the cooling fluid flow path; and
 an abnormality determination step for determining that a temperature abnormality is satisfied when an abnormality determination condition, in which the temperature difference exceeds a preset difference threshold and the power conversion unit temperature exceeds a preset power conversion unit temperature threshold; and
 a second abnormality determination step for determining a temperature abnormality when the abnormality determination condition is not satisfied in the abnormality determination step, if the power conversion unit temperature exceeds a second power conversion unit temperature threshold, which is set to a higher value than the power conversion unit temperature threshold.

2. The temperature abnormality detection method according to claim 1, wherein
a plurality of the power conversion units are provided along the cooling fluid flow path, and
in the difference calculation step, the temperature difference is calculated by calculating
a difference between the power conversion temperature of the power conversion unit and the cooling fluid temperature for a preceding stage power conversion unit that is disposed on an upstream side in the cooling fluid flow path among the plurality of the power conversion units, and
a difference between the power conversion unit temperature of a subsequent stage power conversion unit and a temperature obtained by adding a loss component, which is converted to a temperature, of the preceding stage power conversion unit to the cooling fluid temperature for the subsequent stage power conversion unit that is disposed further downstream in the cooling fluid flow path than the preceding stage power conversion unit.

3. A temperature abnormality detection device for a power conversion device, the temperature abnormality detection device comprising:
a power conversion unit that converts and transmits electric power;
a cooling fluid flow path that passes through the power conversion unit and cools the power conversion unit;
a power conversion unit temperature detection unit that detects a power conversion unit temperature of the power conversion unit;
a cooling fluid temperature detection unit that detects a cooling fluid temperature in the cooling fluid flow path; and
an abnormality determination unit that receives as inputs the cooling fluid temperature and the power conversion unit temperature, calculates a temperature difference between the power conversion unit temperature and the cooling fluid temperature, and determines a temperature abnormality when an abnormality determination condition is satisfied, in which the temperature difference exceeds a preset difference threshold and the power conversion unit temperature exceeds a preset power conversion unit temperature threshold, and
the abnormality determination unit determines a temperature abnormality when the abnormality determination condition is not satisfied, if the power conversion unit temperature exceeds a second power conversion unit temperature threshold, which is set to a higher value than the power conversion unit temperature threshold.

* * * * *